(12) United States Patent
Kim et al.

(10) Patent No.: US 11,099,697 B2
(45) Date of Patent: Aug. 24, 2021

(54) INPUT DETECTION UNIT AND DISPLAY DEVICE INCLUDING THE SAME

(71) Applicant: SAMSUNG DISPLAY CO., LTD., Yongin-si (KR)

(72) Inventors: Jong-Hwa Kim, Seoul (KR); Il-Joo Kim, Hwaseong-si (KR); Duckjoong Kim, Busan (KR); Kyungsu Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/418,622

(22) Filed: May 21, 2019

(65) Prior Publication Data
US 2020/0012387 A1    Jan. 9, 2020

(30) Foreign Application Priority Data

Jul. 6, 2018 (KR) .................. KR10-2018-0078993

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *H01L 27/323* (2013.01)

(58) Field of Classification Search
CPC . G06F 3/0446; G06F 3/0412; H01L 27/3276; H01L 27/3223; H01L 27/323
See application file for complete search history.

(56) References Cited

U.S. PATENT DOCUMENTS

| | | | | |
|---|---|---|---|---|
| 2009/0213090 A1* | 8/2009 | Mamba | ................. | G06F 3/0446 345/174 |
| 2012/0182233 A1* | 7/2012 | Kim | ...................... | G06F 3/0446 345/173 |
| 2012/0319974 A1* | 12/2012 | Kim | ...................... | G06F 3/0445 345/173 |
| 2013/0181912 A1* | 7/2013 | Oh | ........................ | G06F 3/0446 345/173 |
| 2014/0043292 A1* | 2/2014 | Hashimoto | ........... | G06F 3/0446 345/174 |

(Continued)

FOREIGN PATENT DOCUMENTS

| KR | 10-2016-0072909 | 6/2016 |
|---|---|---|
| KR | 10-1793424 | 10/2017 |

(Continued)

*Primary Examiner* — Vinh T Lam

(74) *Attorney, Agent, or Firm* — F. Chau & Associates, LLC

(57) ABSTRACT

Provided is an input detection unit with a plurality of first electrodes and second electrodes insulated from the first electrodes. Dummy patterns are disposed between the patterns and the detection patterns. A secondary dummy pattern is disposed adjacent to the dummy patterns. Signal lines overlap the non-detection area. The signal lines include a first signal line connected to the patterns and a second signal line connected to the detection patterns. The plurality of patterns includes a row of patterns closest to the non-detection area. The secondary dummy pattern overlaps a portion between the row of patterns closest to the non-detection area and the second signal line.

20 Claims, 15 Drawing Sheets

(56) References Cited

U.S. PATENT DOCUMENTS

| | | | | |
|---|---|---|---|---|
| 2014/0118280 | A1* | 5/2014 | Chang | G06F 3/0445 |
| | | | | 345/173 |
| 2017/0131844 | A1* | 5/2017 | Kurashima | G06F 3/0445 |
| 2017/0139525 | A1* | 5/2017 | Jo | G06F 3/046 |
| 2017/0212629 | A1* | 7/2017 | Cho | G06F 3/0443 |
| 2017/0277325 | A1* | 9/2017 | Xie | G06F 3/0412 |
| 2018/0321772 | A1 | 11/2018 | Park et al. | |
| 2018/0348906 | A1* | 12/2018 | Hwang | G06F 3/0446 |
| 2019/0004656 | A1* | 1/2019 | Hoka | G06F 3/0412 |
| 2019/0056819 | A1 | 2/2019 | Moon et al. | |
| 2019/0179445 | A1* | 6/2019 | Moon | G06F 3/0412 |
| 2019/0250746 | A1 | 8/2019 | Han et al. | |
| 2020/0042118 | A1* | 2/2020 | Mugiraneza | G06F 3/04166 |

FOREIGN PATENT DOCUMENTS

| | | |
|---|---|---|
| KR | 10-1793677 | 10/2017 |
| KR | 10-2019-0020213 | 2/2019 |
| KR | 10-2019-0098295 | 8/2019 |

* cited by examiner

INPUT DETECTION UNIT AND DISPLAY DEVICE INCLUDING THE SAME

CROSS-REFERENCE TO RELATED APPLICATION

This U.S. non-provisional patent application claims priority under 35 U.S.C. § 119 to Korean Patent Application No. 10-2018-0078993, filed on Jul. 6, 2018, the entire contents of which are incorporated by reference herein.

1. TECHNICAL FIELD

The present disclosure relates to a display device, and more particularly, to an input detection unit and a display device including the same.

2. DISCUSSION OF THE RELATED ART

The display device includes a display area in which an image is displayed. The display device may include a display area of various shapes, including a display area of a square or circular shape.

In addition, the display device may include an input detection unit for detecting a touch input. The input detection unit includes a detection area in which the detection electrodes are arranged. The input detection unit overlaps the display area, and the detection area may have an irregular shape.

The input detection unit includes a non-detection area that is adjacent to the detection area. The signal lines are located. In recent years, a display device has been developed in which a detection area overlapping a display area is enlarged and a non-detection area is reduced. However, as the non-detection area is made smaller, coupling may occur between the signal lines placed in the non-detection area and the detection electrodes arranged in the detection area.

SUMMARY

The present disclosure relates to an input detection unit with increased driving reliability by preventing coupling between signal lines disposed in a non-detection area and electrodes disposed in a detection area, and a display device including the same.

According to an exemplary embodiment of the present inventive concept, an input detection unit is provided. The input detection unit has a substrate including a detection area and a non-detection area adjacent to the detection area. A plurality of first electrodes overlap the detection area, extend in a first, direction, and are arranged successively in a second direction that intersects the first direction. Each of the first electrodes includes a plurality of first connection patterns and a plurality of patterns connected through the first connection patterns. A plurality of second electrodes overlap the detection area, and are insulated from the first electrodes. The second electrodes extend in the second direction and are arranged successively along the first direction. Each of the second electrodes includes a plurality of second connection patterns and a plurality of detection patterns connected through the second connection patterns. Dummy patterns overlap the detection area and are disposed between the patterns and the detection patterns. A secondary dummy pattern disposed adjacent to the dummy patterns. Signal lines overlap the non-detection area. The signal lines include a first signal line connected to the patterns and a second signal line connected to the detection patterns. The plurality of patterns includes a row of patterns closest to the non-detection area. The secondary dummy pattern overlaps a portion between the row of patterns closest to the non-detection area and the second signal line.

According to an exemplary embodiment of the inventive concept, a display device is provided comprising a display substrate including a display area and a non-display area adjacent to the display area. An encapsulation member disposed on the display substrate and including a detection area and a non-detection area adjacent to the detection area. A first conductive layer including a plurality of first connection patterns is disposed on the encapsulation member and overlaps the detection area. A plurality of signal lines overlap the non-detection area. An insulating layer is disposed on the first conductive layer. A second conductive layer is disposed on the insulating layer, overlaps the detection area, and includes a plurality of patterns connected through the first connection patterns, a plurality of second connection patterns, a plurality of detection patterns connected through the second connection patterns, dummy patterns disposed between the patterns and the detection patterns, and a secondary dummy pattern disposed adjacent to the dummy patterns. The signal lines comprise a plurality of first signal lines connected to the patterns and a plurality of second signal lines connected to the detection patterns. Two outermost patterns among patterns of the same row are connected to first ends of the first signal lines and provided as partial shapes of remaining patterns of the same row. The secondary dummy pattern overlaps an area between a first pattern among the two outermost patterns and a second signal line adjacent to the first pattern.

According to an exemplary embodiment of the present inventive concept, an input detection unit comprises a substrate including a detection area with a first area on a plane, a second area protruding in one direction from the first area, and a third area spaced apart from the second area and protruding in the first direction from the first area. A non-detection area is disposed adjacent to the detection area. An input detection unit is configured to detect an input. The input detection unit comprises a first electrode including first patterns with normal patterns disposed in the first area and first notch patterns disposed in the second area and the third area. First connection patterns are configured to connect adjacent first patterns in the first direction. A second electrode including detection patterns is spaced apart from the first patterns. Second patterns including second notch patterns are disposed in the second area and the third area, and second connection patterns are configured to connect the detection patterns. Dummy electrodes are disposed between the first patterns and the second patterns. A connection line is disposed in the non-detection area and connects the second notch patterns disposed in the second area and the third area. A first secondary dummy electrode overlaps the first area. The first dummy electrode is disposed between at least one normal pattern among normal patterns of a same row closest to the connection line and the connection line.

BRIEF DESCRIPTION OF THE FIGURES

The above described and other aspects of the present inventive concept will become more apparent by the following description of exemplary embodiments thereof in conjunction with the attached drawings, in which.

DETAILED DESCRIPTION

Figure 1A:
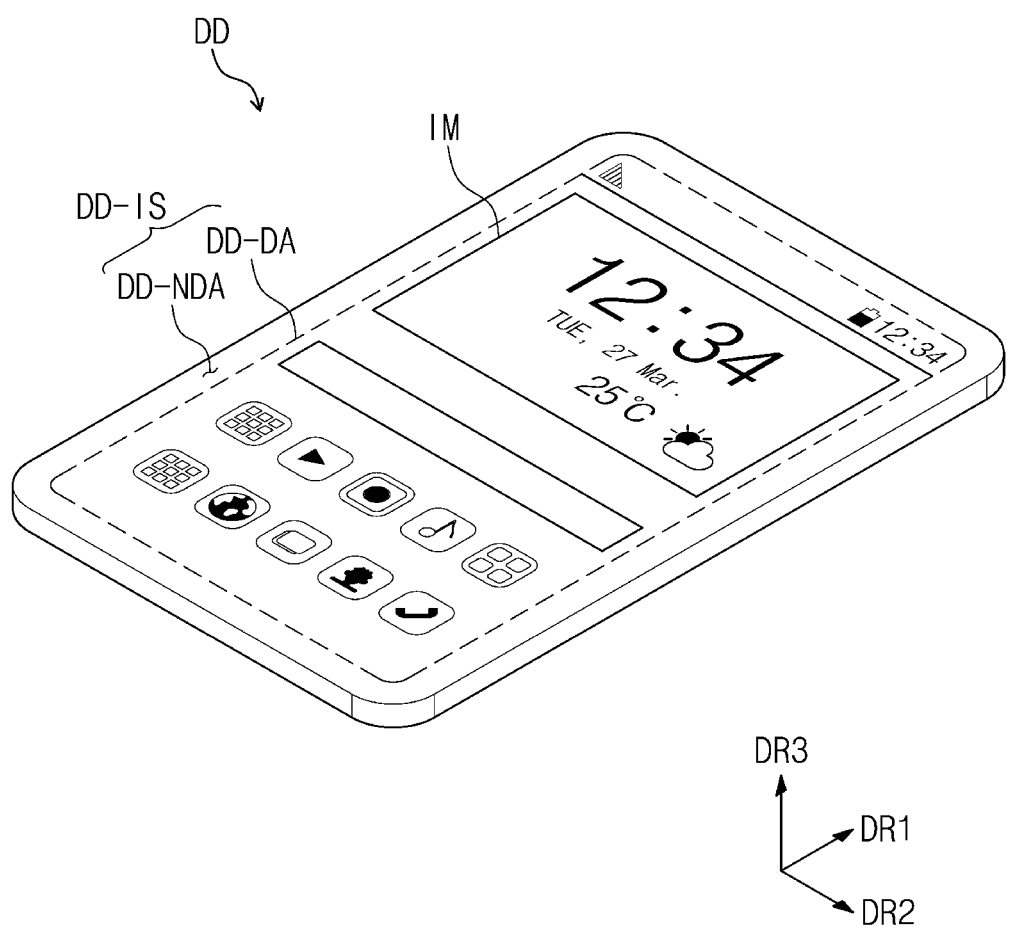
FIG. 1A is a perspective view of a display device according to an exemplary embodiment of the inventive concept.

In this specification, when a component (or an area, a layer, a part, etc.) is referred to as being "disposed on", "connected to" or "combined to" another component, this may mean either that intervening layers are present between the components or that the components are disposed "directly on" one another.

Like reference numerals may refer to like elements throughout the detailed description and figures. Additionally, in the drawings, the thicknesses, proportions, and dimensions of components may be exaggerated for effective description.

It will be understood that the terms "first" and "second" are used herein to describe various components but these components should not be limited by these terms. These terms are used only to distinguish one component from other components. For example, a first component may be referred to as a second component and vice versa without departing from the scope of the inventive concept. The terms of a singular form may include plural forms unless they have a clearly different meaning in the context.

In addition, terms such as "below", "the lower side", "on", and "the upper side" are used to describe a relationship of configurations shown in the drawing. The terms are described as a relative concept based on a direction shown in the drawing.

Hereinafter, an exemplary embodiment of the inventive concept will be described with reference to the drawings.

Figure 1B:
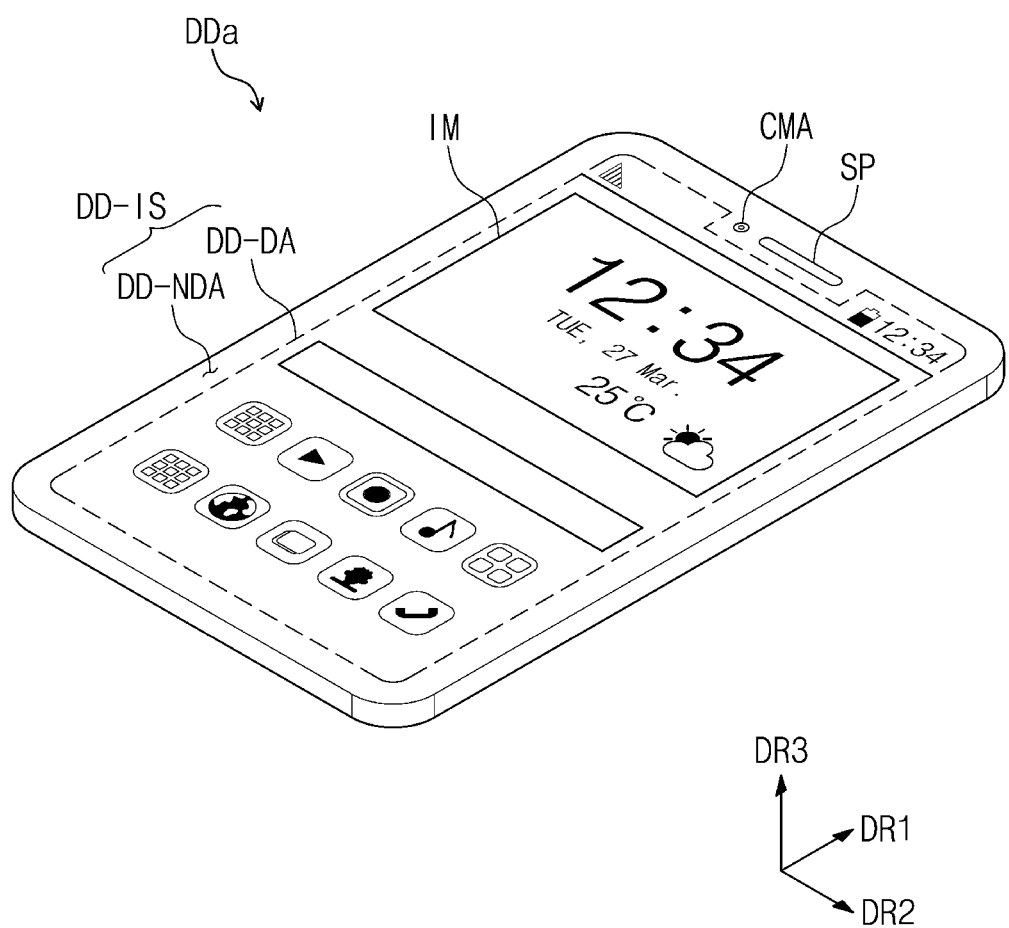
FIG. 1B is a perspective view of a display device according to an exemplary embodiment of the inventive concept.
Figure 1C:
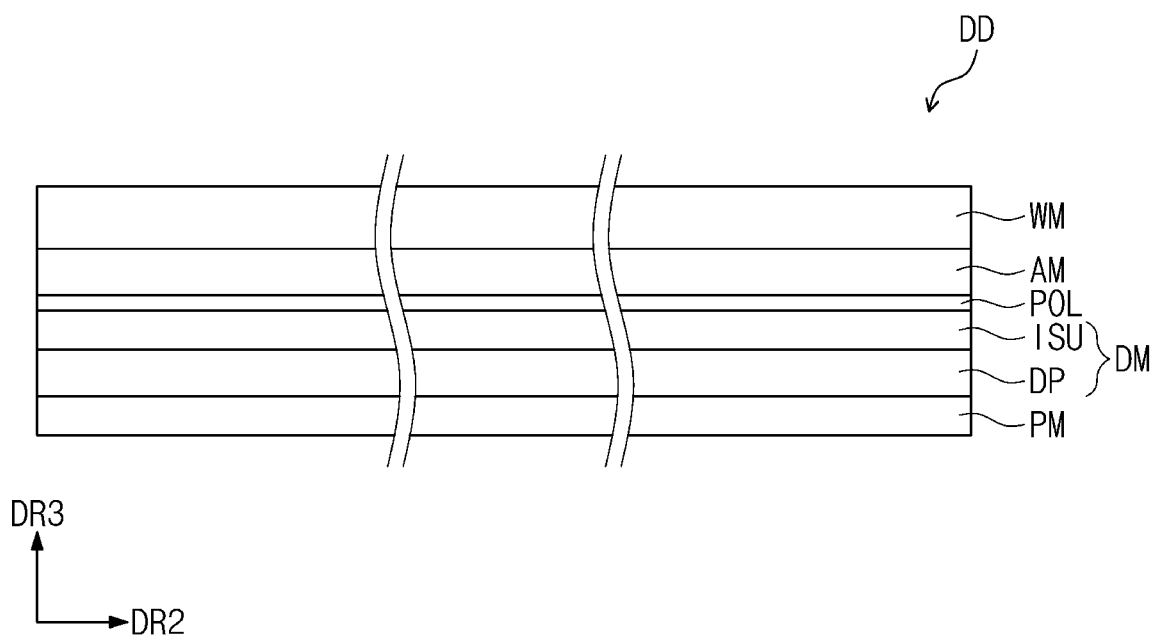
FIG. 1C is a cross-sectional view of a display device according to an exemplary embodiment of the inventive concept.

FIG. 1A is a perspective view of a display device according to an exemplary embodiment of the inventive concept. FIG. 1B is a perspective view of a display device according to an exemplary embodiment of the inventive concept. FIG. 1C is a cross-sectional view of a display device according to an exemplary embodiment of the inventive concept.

Referring to FIG. 1A, a display device DD may display an image IM through a display surface DD-IS. An example of an image IM is a clock display window and application icons. The display surface DD-IS includes a display area DD-DA where the image IM is displayed and a non-display area DD-NDA adjacent to the display area DD-DA. The non-display area DD-NDA is an area where no image is displayed.

For example, the non-display area DD-NDA may at least partially surround the display area DD-DA. However, the inventive concept is not limited to this, and the non-display area DD-NDA may be adjacent to only a part of the display area DD-DA, or may be omitted.

The display surface DD-IS may have a shape extending in a first direction DR1 and a second direction DR2 that intersects the first direction DR1. The normal direction of the display surface DD-IS, that is, a thickness direction of the display device DD, indicates a third direction DR3. The front surface (or the upper surface) and the back surface (or lower surface) of each of the members or units described below are distinguished by the third direction DR3. According to an exemplary embodiment of the inventive concept, at least a part of the display surface DD-IS on the plane may include a curve. For example, on a plane, the display surface DD-IS may include a first side extending in a first direction DR1, a second side extending in the second direction DR2, a third side extending in the first direction DR1 and racing the first side, and a fourth side extending in the second direction DR2 and facing the second side. In addition, the display surface DD-IS may include: a first curve connecting the first side and the second side; a second curve connecting the second side and the third side; a third curve connecting the third side and the fourth side; and a fourth curve connecting the fourth side and the first side. The first to fourth curves may correspond to the corner portions of the display surface DD-IS.

However, the inventive concept is not limited to this, and at least one of the first to fourth curves may be omitted. For example, the two sides connected to the omitted curve may be directly connected.

Although a part of the display device DD is described as having a curved display surface DD-IS on a plane, it may also include a stereoscopic display surface. The stereoscopic display surface may include a plurality of display areas indicating different directions, and may include, for example, a polygonal columnar display surface.

According to an exemplary embodiment of the inventive concept, the display device DD may include a rigid display device. However, the inventive concept is not limited thereto, and the display device DD according to the inventive concept may be a flexible display device. In an exemplary embodiment, the display device DD that may be applied to a mobile phone terminal is shown. Electronic modules mounted on the main board, a camera module, a power module, and the like may be arranged in a bracket/case together with the display device DD to constitute a mobile phone terminal. The display device DD may be applied to small and medium-sized electronic devices such as tablets, car navigations, game consoles, and smart watches in addition to large-sized electronic devices such as televisions and monitors.

Referring to FIG. 1B, the display device DDa may include a display area DD-DA that includes an irregular shape. For example, the display area DD-DA shown in FIG. 1B may have a display area that includes at least one side that protrudes in the first direction DR1 as compared with the display area DD-DA shown in FIG. 1A. The display device DDa may include a speaker SP and a camera module CMA disposed adjacent to the display area of the protruding shape. The speaker SP and the camera module CMA are arranged to overlap the non-display area DD-NDA and do not overlap the display area DD-DA. The display device DD shown in FIG. 1A may also include a speaker SP and a camera module CMA arranged in the non-display area DD-NDA.

Referring to FIG. 1C, the display device DD includes a protective member PM, a display module DM, a polarizing member POL, an adhesive member AM, and a window member WM.

The display module DM is arranged between the protective member PM and the polarization member POL. The adhesive member AM may bond the window member WM and the polarization member POL. The polarization member POL may be omitted. If the polarization member POL is omitted, the adhesive member AM may bond the window member WM and the display module DM.

The adhesive members AM may include an Optically Clear Adhesive (OCA) film, an Optically Clear Resin (OCR), and/or a Pressure Sensitive Adhesive (PSA) film.

The polarization member POL may polarize the light emitted from the display panel DP. The polarization member POL may be placed on the input detection unit ISU.

The protective member PM prevents external moisture from penetrating the display module DM and absorbs external impact.

The protective member PM may include a plastic film as a base layer. The protective member PM may include a plastic film such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), poly(aryleneether sulfone), and/or a combination thereof.

A material constituting the protective member PM is not limited to plastic resins and may also include an organic inorganic composite material. The protective member PM may include an inorganic material filled in the notes of a porous organic layer and an organic layer. The protective member PM may further include a functional layer formed at a plastic film. The functional layer may include a resin layer and may be formed by a coating method.

Figure 2A:
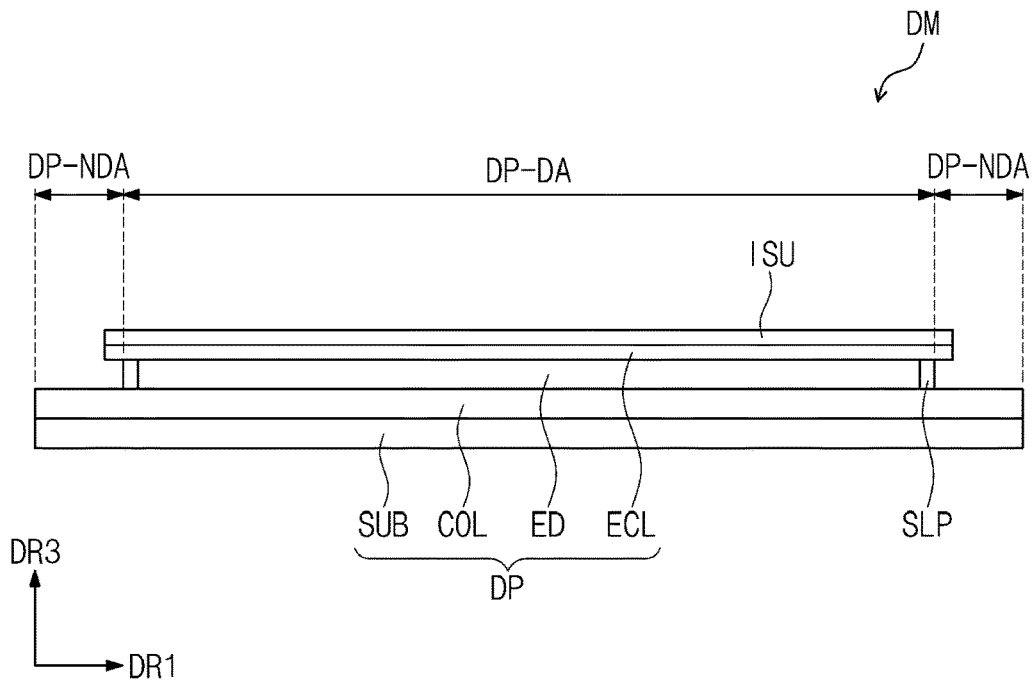
FIG. 2A is a schematic cross-sectional view of a display device according to an exemplary embodiment of the inventive concept.
Figure 2B:
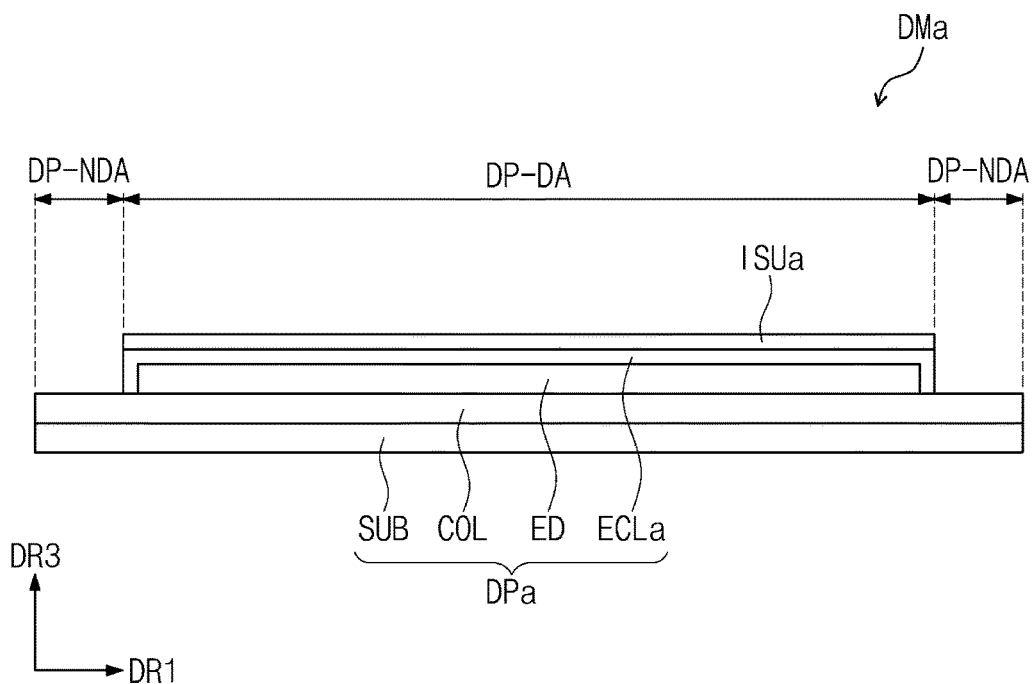
FIG. 2B is a schematic cross-sectional view of a display device according to an exemplary embodiment of the inventive concept.

FIG. 2A is a schematic cross-sectional view of a display device according to an exemplary embodiment of the inventive concept. FIG. 2B is a schematic cross-sectional view of a display device according to an exemplary embodiment of the inventive concept.

Referring to FIG. 2A, the display module DM may include a display panel DP and an input detection unit ISU. The display panel DP may include a light-emitting type display panel, but is not particularly limited. For example, the display panel DP may include an organic light emission display panel or a quantum dot light emission display panel. The light emission layer of the organic light emission display panel includes an organic light emission material. The light emission layer of a quantum dot light emission display panel may include a quantum dot, and/or a quantum rod. Hereinafter, the display panel DP is described as an organic light emission display panel according to an exemplary embodiment, but the inventive concept is not limited thereto.

In detail, the display panel DP includes a substrate SUB, a circuit layer COL, a light emission element layer ED, and an encapsulation substrate ECL.

The substrate SUB may include a plastic substrate, a glass substrate, and/or an organic/inorganic composite substrate. The substrate SUB may also include a laminated structure including a plurality of insulating layers. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and/or perylene resin.

The circuit layer COL may include a plurality of insulating layers, a plurality of conductive layers, and a semiconductor layer. The plurality of conductive layers of the circuit layer COL may constitute signal lines or a control circuit of a pixel.

The light emission element layer ED includes display elements, such as organic light emitting diodes. However, the inventive concept is not limited thereto. For example, depending on the type of the display panel DP, the light emission element layer ED may include inorganic light emitting diodes and/or organic-inorganic hybrid light emitting diodes.

The encapsulation substrate ECL seals the light emission element layer ED. The encapsulation substrate ECL protects the light emission element layer ED from contaminants such as moisture, oxygen, and dust particles. The encapsulation substrate ECL may be coupled to the substrate SUB through an encapsulation member SLP. The encapsulation member SLP may include a first. However, this is merely an example, and the material constituting the encapsulation member SLP is not limited thereto.

The input detection unit ISU may be placed on the encapsulation substrate ECL. Although it is shown in FIG. 2A that the encapsulation substrate ECL is included in the display panel DP, the encapsulation substrate ECL may be included in the input detection unit ISU.

It is described as an example in FIG. 2A that the input detection unit ISU is formed directly on the encapsulation substrate ECL by a continuous process, but the inventive concept is not limited thereto. For example, an adhesive member may be provided between the input detection unit ISU and the encapsulation substrate ECL. The input detection unit ISU and the encapsulation substrate ECL may be combined by an adhesive member.

Referring to FIG. 2B, the display module DMa may include a display panel DPa and an input detection unit ISUa. Compared with the display module DM shown in FIG. 2A, in the display module DMa shown in FIG. 2B, only the configuration of the encapsulation substrate ECL may be different. The remaining configurations may be substantially the same. Therefore, the description of the remaining configurations is omitted for brevity of description.

The display panel DPa includes a substrate SUB, a circuit layer COL, a light emission element layer ED, and a thin film encapsulation layer ECLa.

The thin film encapsulation layer ECLa seals the light emission element layer ED. The thin film encapsulation layer ECLa includes at least one insulating layer. The thin film encapsulation layer ECLa according to an exemplary embodiment of the inventive concept may include at least one encapsulation organic film and at least one encapsulation inorganic film.

The encapsulation inorganic film protects the light emission element layer ED from moisture/oxygen, and the sealing organic film protects the light emission element layer ED from foreign substances such as dust particles. The encapsulation inorganic film may include a silicon nitride layer, a silicon oxynitride layer, a silicon oxide layer, a titanium oxide layer, and/or an aluminum oxide layer and is not limited thereto. The encapsulation organic layer may include an acryl-based organic layer, but is not limited thereto.

The input detection unit ISUa may be formed directly by a continuous process performed on a thin-film encapsulation layer ECLa. However, the inventive concept is not limited thereto, and the input detection unit ISUa may be coupled to the thin film encapsulation layer ECU through an adhesive member. In this case, the input detection unit ISUa may include a base layer and a detection circuit layer. The detection circuit layer may include a plurality of insulating layers, and a plurality of conductive layers. Moreover, the adhesive members may be an organic adhesive layer such as an Optically Clear Adhesive (OCA) film. Optically Clear Resin (OCR), and/or a Pressure Sensitive Adhesive (PSA) film.

Figure 3:
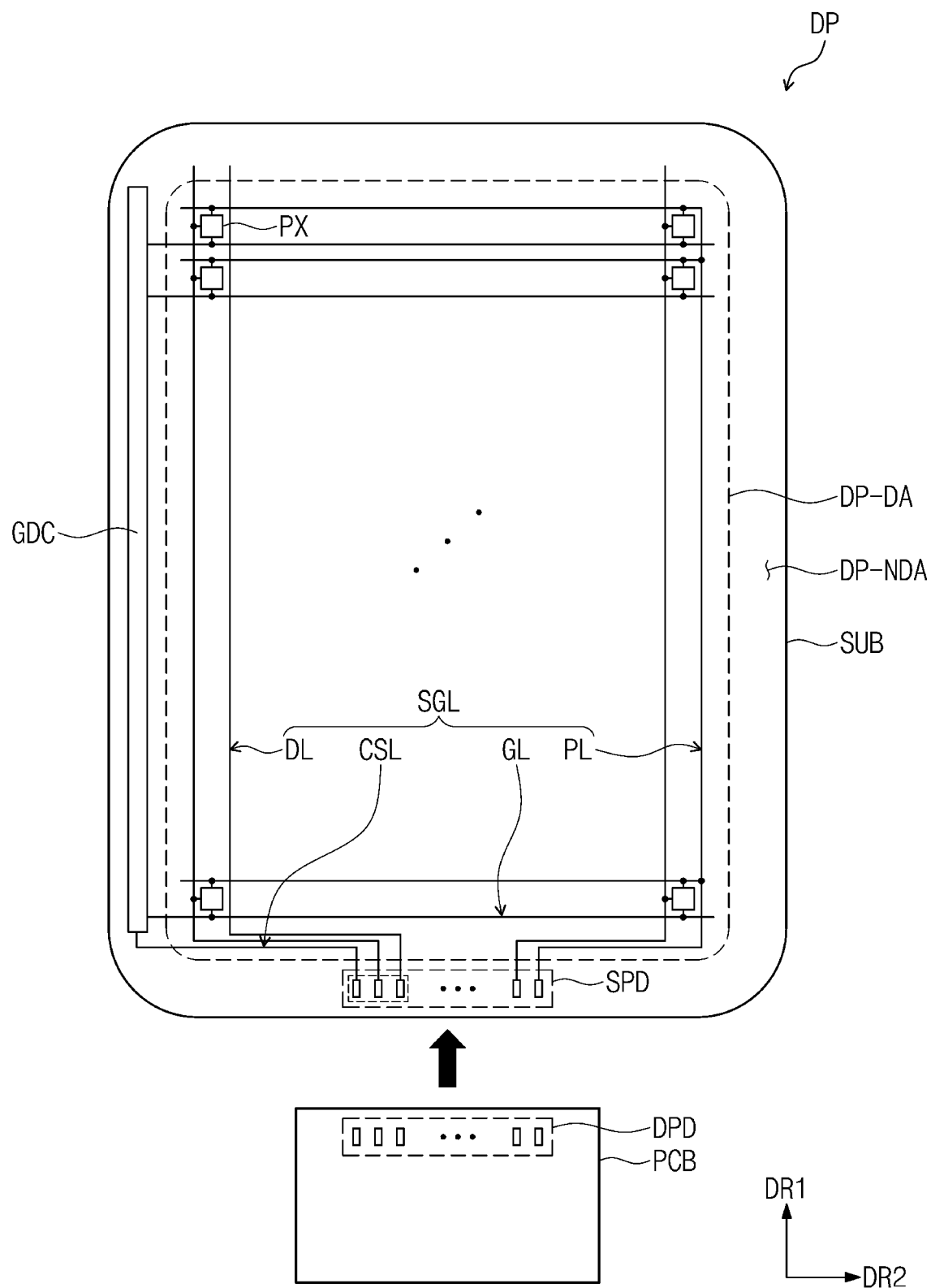
FIG. 3 is a plan view of a display panel according to an exemplary embodiment of the inventive concept.
Figure 4:
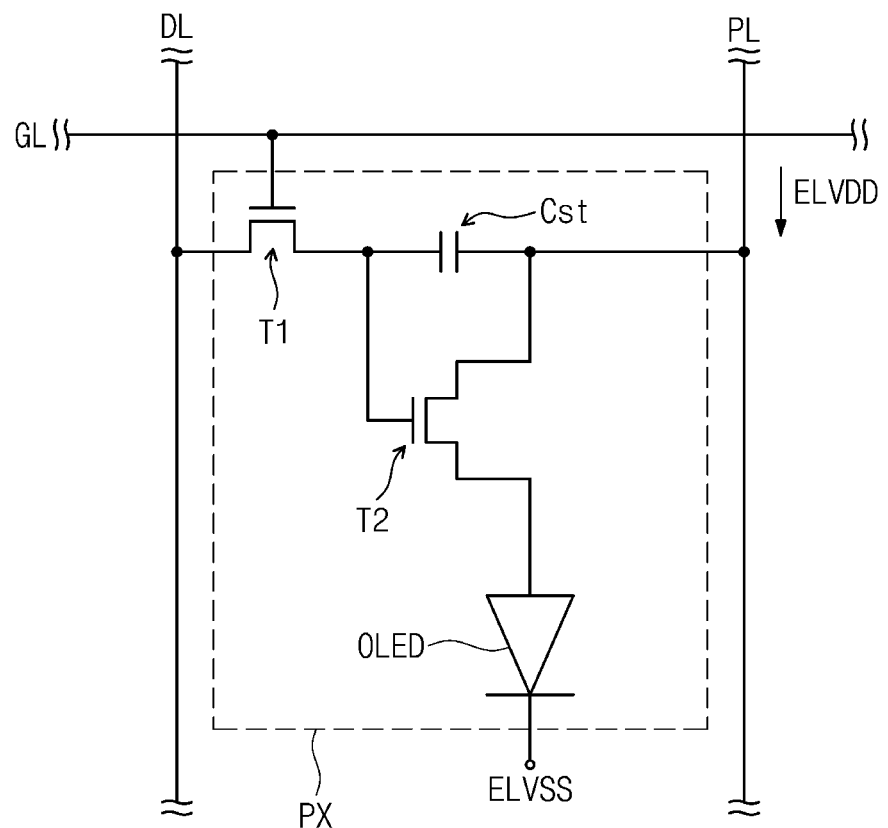
FIG. 4 is an equivalent circuit diagram of a pixel according to an exemplary embodiment of the inventive concept.

FIG. 3 is a plan view of a display panel according to an exemplary embodiment of the inventive concept. FIG. 4 is an equivalent circuit diagram of a pixel of a display device according to an exemplary embodiment of the inventive concept.

Referring to FIG. 3, the display panel DP includes a display area DP-DA and a non-display area DP-NDA. The display area DP-DA and the non-display area DP-NDA of the display panel DP may overlap the display area DD-DA and the non-display area DD-NDA of the display device DD defined in FIGS. 1A and 1B, respectively. The non-display area DP-NDA may be adjacent to only one side of the display area DP-DA or may be omitted altogether.

According to an exemplary embodiment of the inventive concept, the display area DP-DA and the non-display area DP-NDA of the display panel DP may include a curved shape in the corner areas. For example, on a plane, the display area DP-DA may include a first side extending in a first direction DR1, a second side extending in the second direction DR2, a third side extending in the first direction DR1 and lacing the first side, and a fourth side extending in the second direction DR2 and facing the second side. In addition, the display area DP-DA includes a first curve connecting the first side and the second side, a second curve connecting the second side and the third side, a third curve connecting the third side and the fourth side, and a fourth curve connecting the fourth side and the first side. The first to fourth curves may correspond to corner portions of the display area DP-DA.

However, the technical idea of the inventive concept is not limited to this, and at least one of the first to fourth curves may be omitted. In this case, the two sides connected to the omitted curve may be directly connected. Meanwhile, the non-display area DP-NDA is also described as having a curved shape in the corner area, but is not limited thereto, and the non-display area DP-NDA may have a rectangular shape.

The display panel DP may include a driving circuit GDC, a plurality of signal lines SGL, a plurality of pads SPD, and a plurality of pixels PX. The pixels PX are arranged in the display area DP-DA. Each of the pixels PX includes an organic light emitting diode OLED and a pixel driving circuit PDC connected thereto. The driving circuit GDC, the signal lines SGL, the pads SPD, and the pixel driving circuit may be included in the circuit layer COL shown in FIG. 2A.

The driving circuit GDC generates a plurality of scan signals (hereinafter referred to as scan signals), and sequentially outputs the scan signals to a plurality of scan lines GL (hereinafter referred to as scan lines). The driving circuit GDC may further output another control signal to the driving circuit of the pixels PX.

The driving circuit GDC may include a plurality of thin film transistors formed by the same process as the driving circuit of the pixels PX. For example, a Low Temperature Polycrystalline Silicon (LTPS) process or a Low Temperature Polycrystalline Oxide (LTPO) process may be used.

The signal lines SGL overlap the display area DP-DA and the non-display area DP-NDA and are connected to the pads SPD. The signal lines SGL include scan lines GL, data lines DL a power supply line PL, and a control signal line CSL. The scan lines GL are respectively connected to corresponding pixels PX among the plurality of pixels PX, and the data lines DL are respectively connected to corresponding pixels PX among the plurality of pixels PX. The power supply line PL is connected to the pixels PX. The control signal line CSL may provide control signals to the scan driving circuit.

According to an exemplary embodiment of the present inventive concept, a driving chip for electrically connecting the pads SPD and the signal lines SGL may be disposed on the substrate SUB overlapping the non-display area DP-NDA. The driving chip transmits driving signals to data lines DL and a power supply line PL.

The pads SPD may be disposed in a certain area of the substrate SUB overlapping the non-display area DP-NDA. The pads SPD are electrically connected to the circuit board PCB to transmit a driving signal received from the circuit board PCB to the signal lines SGL. The circuit board PCB may be rigid or flexible. For example, if the circuit board PCB is flexible, it may be provided as a flexible printed circuit board.

In addition, the circuit board PCB may include driving pads DPD. On the plane, the driving pads DPD may overlap the pads SPD and connect to the pads SPD.

Referring to FIG. 4, a scan line GL, a data line DL, a power supply line PL, and a pixel PX connected thereto are shown. A configuration of the pixel PX according to the present inventive concept is not limited to the exemplary embodiment shown in FIG. 4 and may be modified.

The organic light emitting diode OLED may be a front-light-emitting-type diode or a rear-light-emitting-type diode. The pixel PX includes a first transistor T1 (or a switching transistor), a second transistor T2 (or a driving transistor), and a capacitor Cst as a pixel driving circuit for driving the organic light emitting diode OLED. The first power voltage ELVDD is supplied to the second transistor T2 and the second power voltage ELVSS is supplied to the organic light emitting diode OLED. The second voltage ELVSS may have a lower level than the first voltage ELVDD.

The first transistor T1 outputs a data signal applied to the data line DL in response to a scan signal applied to the scan line GL. The capacitor Cst charges a voltage corresponding to a data signal received from the first transistor T1. The second transistor T2 is connected to the organic light emitting diode OLED. The second transistor T2 controls a driving current flowing through the organic light emitting diode OLED in correspondence to a charge amount stored in the capacitor Cst.

The equivalent circuit represents an exemplary embodiment, but the inventive concept is not limited thereto. The pixel PX may further include a plurality of transistors, and may include a larger number of capacitors. The organic light emitting diode OLED may be connected between the power supply line PL and the second transistor T2.

In addition, the organic light emitting diode OLED included in the pixel PX may be included in the light emission element layer ED shown in FIG. 2A, and the transistors T1 and T2 may be included in the circuit layer COL.

Figure 5:
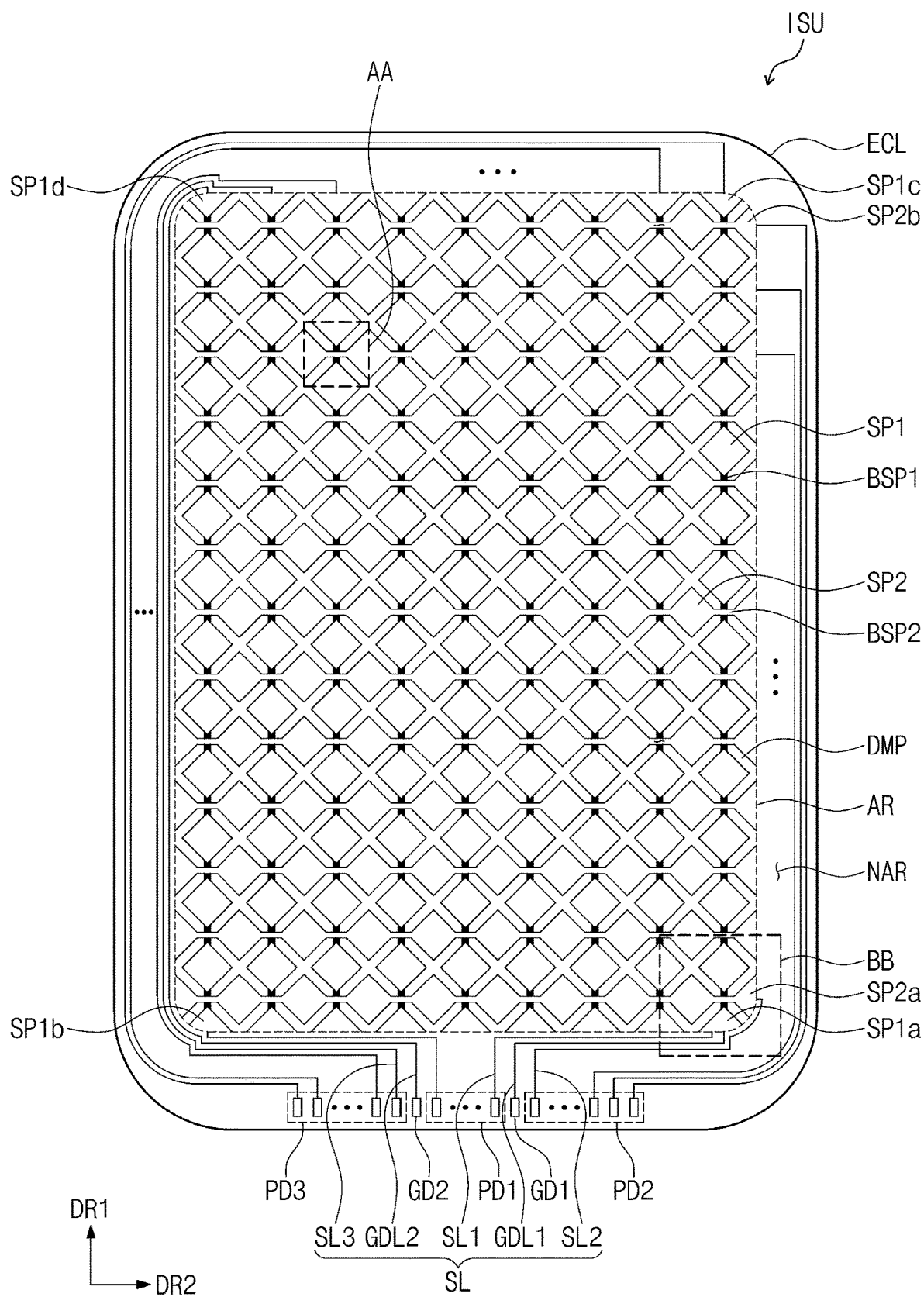
FIG. 5 is a plan view of an input detection unit according to an exemplary embodiment of the inventive concept.
Figure 6A:
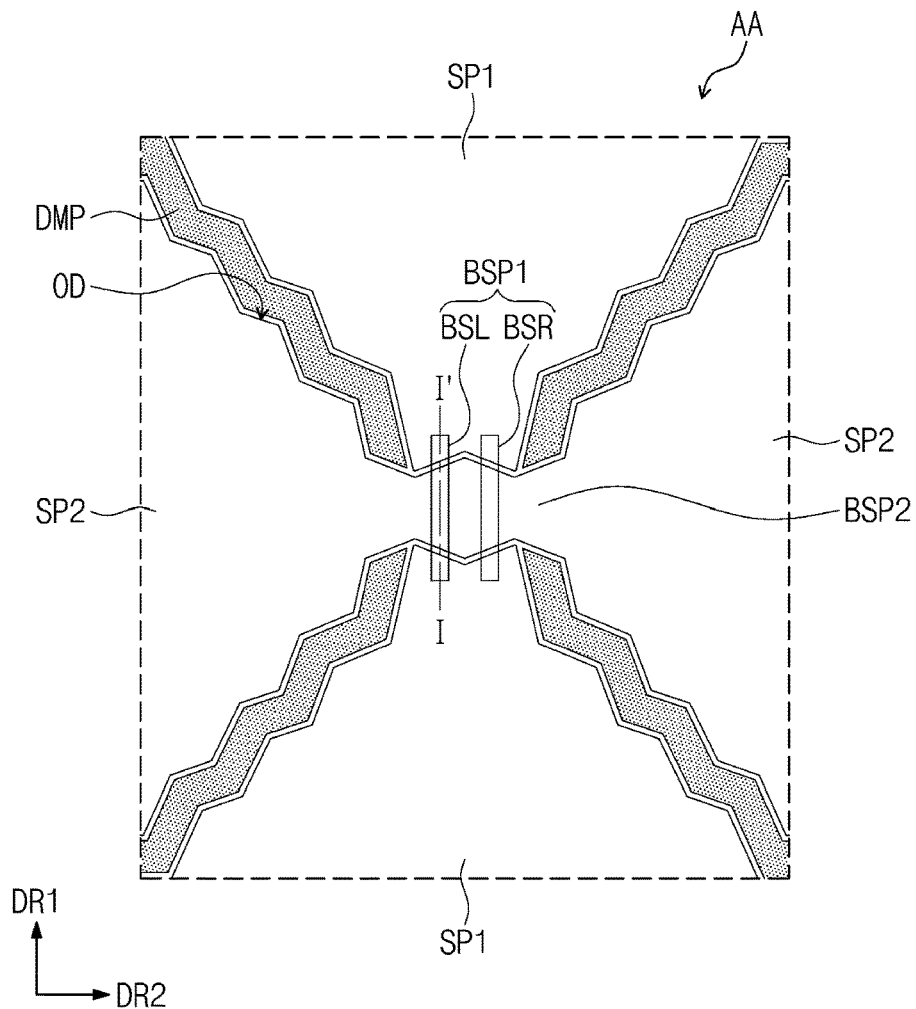
FIG. 6A is an enlarged view of an area AA shown in FIG. 5.
Figure 6B:
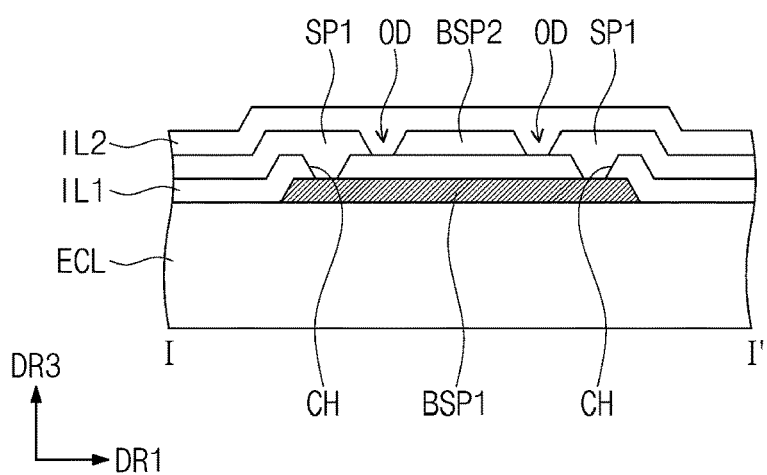
FIG. 6B is a cross-sectional view taken along the line I-I' shown in FIG. 6A.

FIG. 5 is a plan view of an input detection unit according to an exemplary embodiment of the inventive concept. FIG. 6A is an enlarged view of an area AA shown in FIG. 5. FIG. 6B is a cross-sectional view taken along the line I-I' shown in FIG. 6A.

Referring to FIG. 5, an input detection unit ISU includes a detection area AR and a non-detection area NAR adjacent to the detection area AR. The detection area AR of the input detection unit ISU may overlap the display area DP-DA of the previously defined display panel DP. The non-display area DP-NDA of the display panel DP may overlap the non-detection area NAR of the input detection unit ISU. According to an exemplary embodiment of the inventive concept, the non-detection area NAR may be adjacent to only one side of the detection area AR or may be omitted.

According to an exemplary embodiment of the present inventive concept, the detection area AR may be an area that detects an externally applied input. The external input applied may be, for example, a touch by a user's hand. The externally applied input may be provided in various forms. For example, the external input includes various types of external inputs such as a part of the user's body, a stylus pen, light, heat, or pressure. In addition, an input to which a part of the body, such as a user's hand, touches the detection area AR may also be a touch applied to a neighboring or adjacent space to the detection area AR (e.g., hovering).

According to an exemplary embodiment of the inventive concept, on a plane, the display area DP-DA of the display panel DP may be smaller than the detection area AR of the input detection unit ISU. Also, on a plane, the non-display area DP-NDA of the display panel DP may be larger than the detection area AR of the input detection unit ISU. This will be described in detail later.

According to an exemplary embodiment of the inventive concept, the detection area AR and the non-detection area NAR of the input detection unit ISU may be provided in a curved shape on a plane. This may be substantially the same as the shape of the display area DP-DA described above, and a description thereof will be omitted. For example, on a plane, the corner portions of the detection area AR may have a curved shape.

In detail, the input detection unit ISU may include first electrodes, second electrodes, signal lines, and dummy electrodes.

The first electrodes extend in the first direction DR1 and are arranged in the second direction DR2, and may be provided with n (n is a natural number). Each of the first electrodes may include a plurality of first connection patterns BSP1 overlapping the detection area AR and connecting the plurality of patterns SP1 and the patterns SP1. For example, the first connection patterns BSP1 may electrically connect two patterns SP1 adjacent to each other in the first direction DR1. Patterns SP1 may be disposed in electrically connected columns that extend in the first direction DR1 and are spaced apart from one another in a second direction DR2 in which consecutive patterns are connected by a series of first connection patterns BSP1.

The second electrodes extend in the second direction DR2 and are arranged in the first direction DR1, and may be provided with m (m is a natural number. Each of the second electrodes may include a plurality of second connection patterns BSP2 overlapping the detection area AR and connecting detection patterns SP2. The detection patterns SP2 may be isolated from the patterns SP1 on a plane and insulated from each other. For example, one second connection pattern BSP2 may electrically connect two detection patterns SP2 adjacent to each oilier in the second direction DR2. Detection patterns SP2 may be disposed in electrically connected rows that extend in the second direction DR2; consecutive patterns are electrically connected by a series of second connection patterns BSP2. The rows of detection patterns SP2 may be spaced apart from one another in a first direction DR1.

The patterns SP1 and detection patterns SP2 may include a diamond lattice shape. For example, adjacent patterns SP1 and detection patterns SP2 may have a staggered orientation with respect to one another and form distinct rows and columns.

The first connection pattern BSP1 and the second connection pattern BSP2 may intersect each other on a plane and may be insulated from each other on a cross section.

The dummy electrode includes dummy patterns DMP overlapping the detection area AR and disposed between the patterns SP1 and the detection patterns SP2 and a secondary dummy pattern SDMP (described in more detail with reference to FIG. 7A) adjacent to the dummy patterns DMP. According to an exemplary embodiment, the patterns SP1, the first connection patterns BSP1, the detection patterns SP2, the second connection patterns BSP2, and the dummy electrode include a transparent conductive oxide. Hereinafter, for convenience of explanation, the patterns SP1, the first connection patterns BSP1, the detection patterns SP2, the second connection patterns BSP2, and the dummy electrodes are described as electrodes.

The electrodes may include, for example, at least one of indium zinc oxide (IZO), indium tin oxide (ITO), indium gallium oxide (IGO), indium zinc gallium oxide (IGZO), and/or mixtures/compounds thereof. However, the inventive concept is not limited thereto. For example, the first electrode may include a metallic material such as molybdenum, silver, titanium, copper, aluminum, and/or an alloy thereof. The electrodes may be provided with a metal mesh structure to reduce the possibility that the patterns will be visible from the outside.

The signal lines include first signal lines SL1, second lines SL2, third signal lines SL3, a first dummy line GDL1, and a second dummy line GDL1 overlapping the non-detection area NAR. The first to third signal lines SL1 to SL3 and the first and second dummy lines GDL1 to GDL2 may include a metal material. The metallic material, for example, may include molybdenum, silver, titanium, copper, aluminum, and/or an alloy thereof.

First ends of the first signal lines SL1 are connected to patterns SP1, and the second ends of the first signal lines SL1 are connected to first pads PD1. The patterns SP1 connected to first ends of the first signal lines SL1 may be patterns of the first row adjacent to the first pads PD1 and arranged in the second direction DR2.

First ends of the second signal lines SL2 are respectively connected to the detection patterns SP2 and the second ends of the second signal lines SL2 are respectively connected to the second pads PD2. The detection patterns SP2 respectively connected to first ends of the second signal lines SL2 may be the detection patterns of the first column arranged in the first direction DR1.

First ends of the third signal lines SL3 are respectively connected to the patterns SP1 and the second ends of the third signal lines SL3 are respectively connected to the third pads PD3. Here, the patterns SP1 respectively connected to first ends of the third signal lines SL3 may be arranged in the second direction DR2 and may be patterns SP1 of the n-th row farthest from the first row in the first direction DR1. By connecting a plurality of lines with respect to one pattern SP1, sensitivity of an electrical signal depending on a position may be increased.

The first to third signal lines SL1 to SL3 may receive electrical signals from the first to third pads PD1 to PD3, respectively. The first to third pads PD1 to PD3 may be provided with a driving signal through the circuit board PCB illustrated in FIG. 3 or may be electrically connected to a separate circuit board to receive a driving signal.

The first to third signal lines SL1 to SL3 may provide an electrical signal provided from the first to third pads PD1 to PD3 to the patterns SP1 and the detection patterns SP2 arranged in the detection area AR. In addition, the first to third signal lines SL1 to SL3 may transmit an external touch detection signal generated in the detection area AR to corresponding pads of the first to third pads PD1 to PD3.

The first dummy line GDL1 may be disposed between the first signal lines SL1 and the second signal lines SL2. The first dummy line GDL1 may prevent coupling between the first signal lines SL1 and the second signal lines SL2. For example, when a voltage level difference occurs between the first signal lines SL1 and the voltage applied to the second signal lines SL2, coupling may occur between the two lines. The first dummy line GDL1 may suppress coupling caused by the voltage difference between the two lines. Here, coupling is defined as two metals influencing each other's signal levels due to an electric field or a magnetic field.

A first end of the first dummy line GDL1 may be disposed adjacent to patterns of the first row. The second end of the first dummy line GDL1 may be connected to the first dummy pad GD1. For example, a ground voltage may be provided to the first dummy line GDL1.

The second dummy line GDL2 is disposed between the first signal lines SL1 and the third signal lines SL3 thereby preventing coupling of the voltage applied to the first signal lines SL1 and the voltage applied to the third signal lines SL3. A first end of the second dummy line GDL2 may be disposed adjacent to any one of the patterns of the n-th row. The second end of the second dummy line GDL2 may be connected to the second dummy pad GD2. For example, the second dummy line GDL2 may be provided with a ground voltage.

On the other hand, although it is described that the first dummy line GDL1 and the second dummy line GDL2 are connected to the pads to receive the ground voltage, the inventive concept is not limited thereto. That is, signals might not be provided to the first dummy line GDL1 and the second dummy line GDL2. In this case, the first dummy line GDL1 and the second dummy line GDL2 may be in a floating state.

Referring to FIG. 6A, two patterns SP1, one first connection pattern BSP1 connecting them, two detection patterns SP2, and one second connection pattern BSP2 connecting them are shown exemplarily. For example, two adjacent patterns SP1 are connected to one another by one first connection pattern BSP1, and two detection patterns SP2 adjacent to one another are connected by a second connection pattern BSP2.

According to the exemplary embodiment, the first connection pattern BSP1 includes a first branch part BSL and a second branch part BSR. The first branch part BSL and the second branch part BSR are disposed apart from each other in the second direction DR2 and extend in the first direction DR1. For example, the first branch part BSL and the second branch part BSR may connect adjacent patterns SP1, and each may have a width that extends in the second direction DR2 and a length that extends in the first direction DR1. The first branch part BSL and the second branch part BSR may be substantially parallel to one another, but the inventive concept is not limited thereto. The first connection pattern BSP1 overlaps the second connection pattern BSP2 from a plan view perspective.

Referring to FIG. 6B, the first connection pattern BSP1 is disposed on an encapsulation substrate ECL. The first connection pattern BSP1 may be at least partially covered by a first insulating layer IL1 and may include a plurality of contact holes CH. For example, the contact holes CH may be holes that penetrate the first insulating later IL1 exposing a surface of the first connection part BSP1.

Patterns SP1 and a second connection pattern BSP2 are disposed on the first insulating layer IL1. The contact holes CH expose a part of the first connection pattern BSP1. A part of the first connection pattern BSP1 exposed by the contact holes CH is connected to the patterns SP1 and the spaced patterns SP1 are electrically connected by the first connection patient BSP1.

The second connection pattern BSP2 may be disposed on the first insulating layer IL1 between the spaced patterns SP1. The second connection pattern BSP2 may be disposed apart from the patterns SP1. The second connection pattern BSP2 and the patterns SP1 may be covered by the second insulating layer IL2.

According to an exemplary embodiment of the inventive concept, the first connection pattern BSP1, the first to third signal lines SL1 to SL3, and the first and second dummy lines GDL1, to GDL2 are arranged on the same layer, and each may be placed on an encapsulation substrate ECL. The patterns SP1, the detection patterns SP2, the second connection patterns BSP2, the dummy patterns DMP, and the secondary dummy patterns SDMP (see FIG. 7A) may be arranged on the same layer, and each may be placed on the first insulating layer IL1. However, the technical idea of the inventive concept is not limited to this, and the arrangement structure between the structures may be variously changed according to an exemplary embodiment.

Referring again to FIG. 6A, the dummy pattern DMP may be disposed between the patterns SP1 and the detection patterns SP2 on a plane. The dummy pattern DMP may be disposed at the boundary between the patterns SP1 and the detection patterns SP2. The dummy pattern DMP may be disposed with a spacing space OD at the boundaries of each of the patterns SP1 and the detection patterns SP2. That is, the dummy pattern DMP may be a floating pattern spaced apart from the patterns SP1 and the detection patterns SP2. The dummy pattern DMP may prevent the interval between the patterns SP1 and the detection patterns SP2 from being visible.

Although the dummy pattern DMP is shown as being arranged in a single pattern between the patterns SP1 and the detection patterns SP2 in FIG. 6A, the inventive concept is not limited thereto. The dummy pattern DMP may include a plurality of dummy patterns DMP spaced apart from each other.

In addition, as shown in FIG. 6A, it is shown that the patterns SP1, the detection patterns SP2, and the dummy pattern DMP are provided in a stepped shape. However, the inventive concept is not limited thereto, and they may be straight or may include a groove. Since the dummy pattern DMP has a stepped shape, the detection surface area for external input may be increased compared to the same area without. Accordingly, it is possible to provide an input detection unit with increased touch sensitivity.

Referring again to FIG. 5, the outermost two patterns SP1*a* and SP1*b* of the first row patterns connected to first ends of the first signal lines SL1 are provided as partial shapes of the remaining patterns of the first row. In the same manner, the outermost two patterns SP1c and SP1d among the patterns of the n-th row connected to first ends of the third signal lines SL3 may be provided as partial shapes of the remaining patterns of the n-th row.

According to an exemplary embodiment in which the corner portions of the detection area AR described above are provided in a curved shape, each of the outermost two patterns SP1a, SP1b, SP1c, and SP1d may include a curved shape corresponding to the corner portions.

Although it is described that the two outermost patterns SP1a and SP1b of the patterns of the first row are provided as partial shapes of the remaining patterns of the first row, they are not limited thereto. For example, a plurality of patterns adjacent to the outermost patterns of the first row may be provided as partial shapes of the remaining patterns of the first row.

The other end of the first dummy line GDL1 is disposed adjacent to the first pattern SP1a of the two patterns SP1a and SP1b, and the first pattern SP1a is electrically connected to the first signal line SL1 closest to the first dummy line GDL1 of the first signal lines SL1.

The two outermost detection patterns SP2a and SP2b among the detection patterns of the first row closest to first ends of the second signal lines SL2 may be provided as partial shapes of the remaining detection patterns of the first row. In particular, the first detection pattern SP2a of the two outermost detection patterns SP2a and SP2b may be adjacent to the first pattern SP1a of the two outermost patterns SP1a and SP1b. The first detection pattern SP2a is electrically connected to the second signal line SL2 closest to the first dummy line GDL1 of the second signal lines SL2.

Figure 7A:
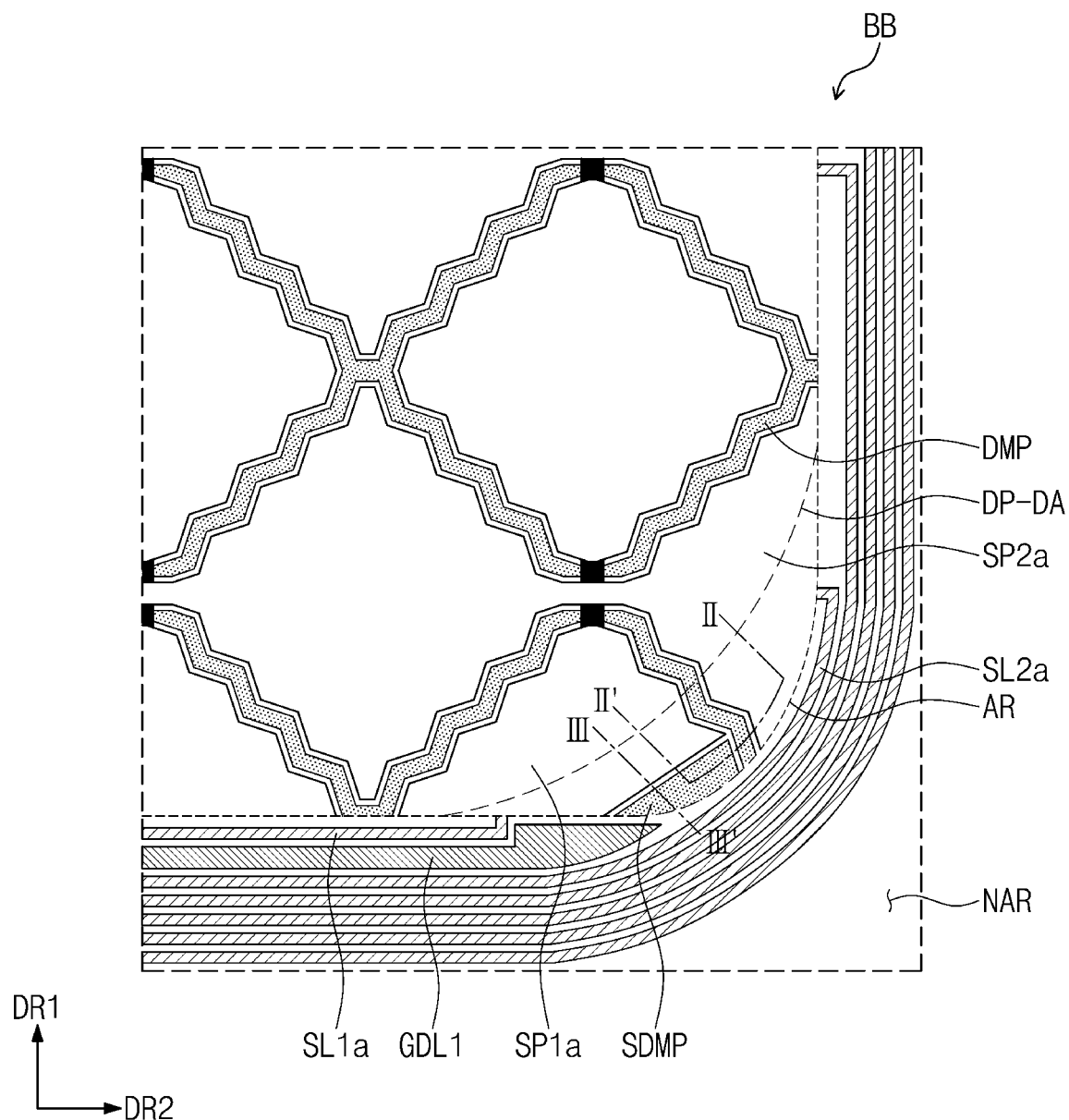
FIG. 7A is an enlarged view of an area BB shown in FIG. 5 according to an exemplary embodiment of an inventive concept.
Figure 7B:
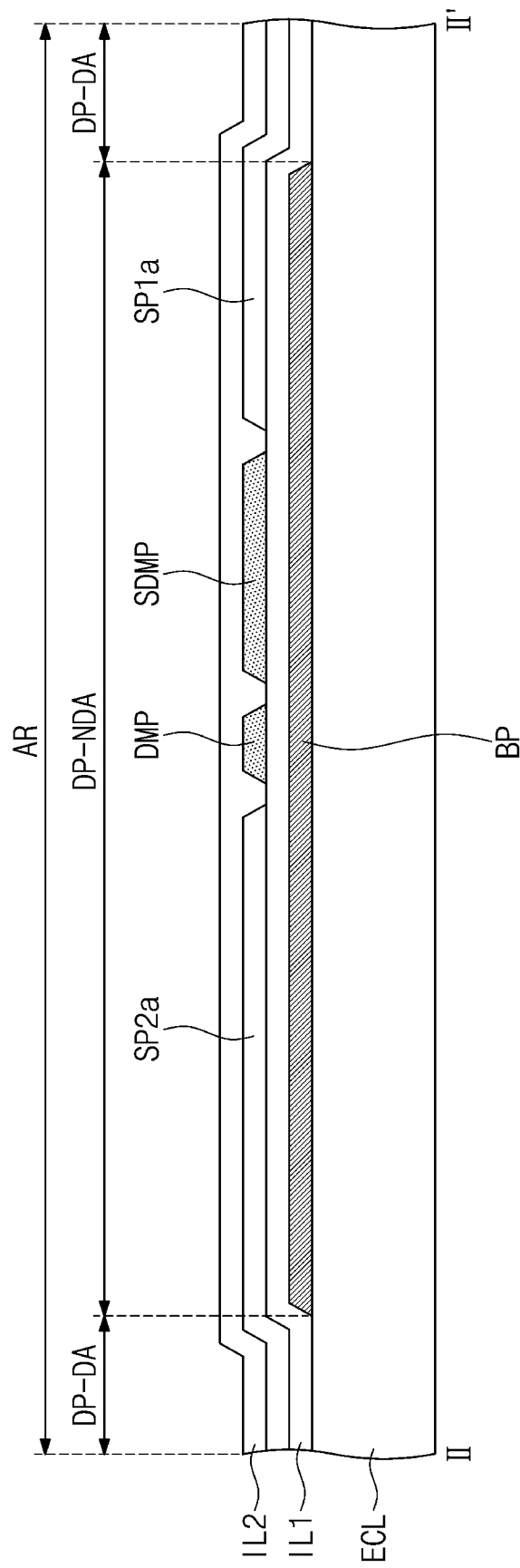
FIG. 7B is a cross-sectional view taken along the line II-II' shown in FIG. 7A.
Figure 8:
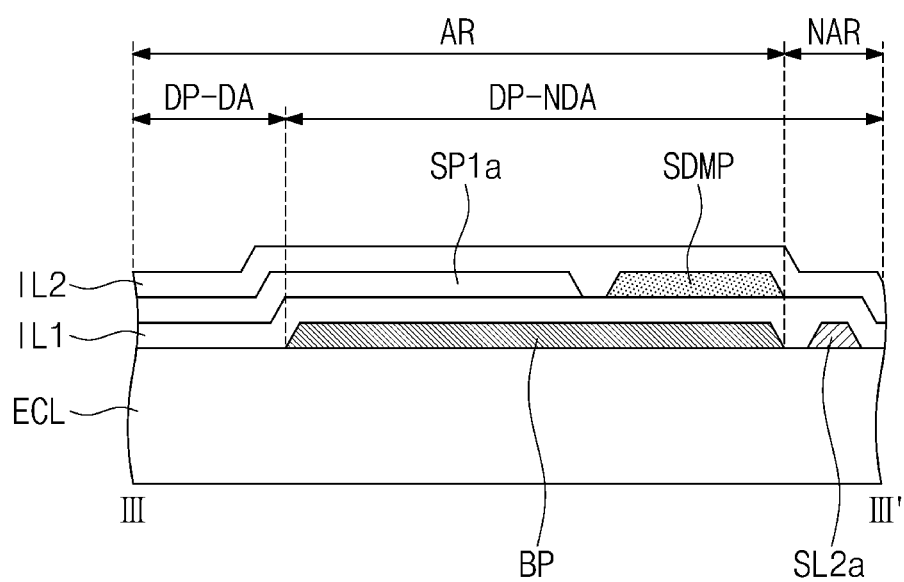
FIG. 8 is a cross-sectional view taken along the line III-III' shown in FIG. 7A.

FIG. 7A is an enlarged view of an area BB shown in FIG. 5 according to an exemplary embodiment of the inventive concept. FIG. 7B is a cross-sectional view taken along the line II-II' shown in FIG. 7A. FIG. 8 is a cross-sectional view taken along the line III-III' shown in FIG. 7A.

According to an exemplary embodiment of the inventive concept, the first signal line SL1a of the first signal lines SL1 is described as being closest to the first dummy line GDL1 on a plane and connected to the first pattern SP1a. The second signal line SL2a of the second signal lines SL2 is described as being closest to the first dummy line GDL1 and connected to the second detection pattern SP2a.

As described above, the corner portions of the detection area AR may be provided in a curved shape. When the secondary dummy pattern SDMP shown in FIG. 7A is omitted, the outer portions of the first pattern SP1a and the second detection pattern SP2a on a plane may have a curved shape having the same curvature. As described above, the corner portions of the detection area AR may be provided in a curved shape. However, in this case, the interval between the first pattern SP1a and the second signal line SL2a is very narrow, so that coupling may occur due to a voltage difference between the first pattern SP1a and the second signal line SL2a. As a result, the driving reliability of the input detection unit ISU may be decreased.

According to an exemplary embodiment of the inventive concept, in order to prevent coupling between the first pattern SP1a and the second signal line SL2a, a secondary dummy pattern SDMP may be disposed between the first pattern SP1a and the second signal line SL2a. A secondary dummy pattern SDMP may overlap the detection area AR. For example, a secondary dummy pattern SDMP may be disposed adjacent to the first pattern SP1a. As shown in FIG. 7A, the first pattern SP1a and the second signal line SL2a may be spaced apart from each other on a plane with the first dummy line GDL1 and the secondary dummy pattern SDMP disposed there between.

As described above, the secondary dummy pattern SDMP may be in a floating state. The first dummy line GDL1 may be in a floating state or may be provided with a ground voltage. Therefore, coupling between the first pattern SP1a and the second signal line SL2a may be prevented by the presence of the secondary dummy pattern SDMP and the first dummy line GDL1.

According to an exemplary embodiment of the inventive concept, on a plane, the area of the first pattern SP1a may be larger than the area of the secondary dummy pattern SDMP. The sum of the area of the first pattern SP1a and the area of the secondary dummy pattern SDMP may be smaller than the area of each of the remaining first patterns of the first row. Also, for the curved shape of the corner portion of the detection area AR, one outer portion of the secondary dummy pattern SDMP corresponding to the interface with the non-detection area NAR and one outer portion of the second detection pattern SP2a may be provided in a curved shape having the same curvature.

In addition, on a plane, according to an exemplary embodiment of the inventive concept, the area of the first patient SP1a may be smaller than the area of the first pattern SP1a when the secondary dummy pattern SDMP is omitted. This is because the area of the existing first pattern SP1a is reduced by the area occupied by the secondary dummy pattern SDMP. As the area of the first pattern SP1a is reduced, the area of the second detection pattern SP2a adjacent thereto may be larger than the area of the first pattern SP1a.

The display area DP-DA of the display panel DP described above with reference to FIG. 3 may be smaller than the detection area AR of the input detection unit ISU. This may provide a further curved corner portion of the image seen in actual appearance.

Referring to FIG. 7B, a part of the non-display areas DP-NDA may overlap the detection area AR. In this case, the secondary dummy pattern SDMP overlaps the detection area AR, but might not overlap the display area DP-DA. That is, the secondary dummy pattern SDMP may overlap the non-display area DP-NDA.

For example, as shown in FIG. 7A, the first pattern SP1a may include a first portion overlapping the display area DP-DA and a second portion extending from the first portion and overlapping the detection area AR region that is not overlapped by the display area DP-DA. Likewise, the second detection pattern SP2a may include a first detection portion overlapping the display area DP-DA and a second detection portion extending from the first detection portion and overlapping the detection area AR region that is not overlapped by the display area DP-DA.

Also, according to an exemplary embodiment of the inventive concept, the input detection unit ISU may further include a light blocking pattern BP. The light blocking pattern BP may be disposed on an encapsulation substrate ECL overlapping the non-display area DP-NDA and overlapping a portion of the detection area AR. For example, the light blocking pattern BP may entirely overlap the detection area AR in a region overlapping the non-display area DP-NDA. Thus, configurations overlapping the non-display area DP-NDA and the detection area AR may be prevented from being visible to the outside.

Referring to FIG. 8, a secondary dummy pattern SDMP may overlap a portion of the detection area AR disposed between the first pattern SP1a and the second signal line SL2a on a plane. When the voltage applied to the second signal line SL2a and the voltage applied to the first pattern SP1a are different from each other, coupling may occur therebetween. However, according to the inventive concept, as the floating secondary dummy pattern SDMP is disposed between the first pattern SP1a and the second signal line SL2a, the voltage drop due to a coupling occurrence in the first pattern SP1a and the second signal line SL2a may be prevented.

Figure 9A:
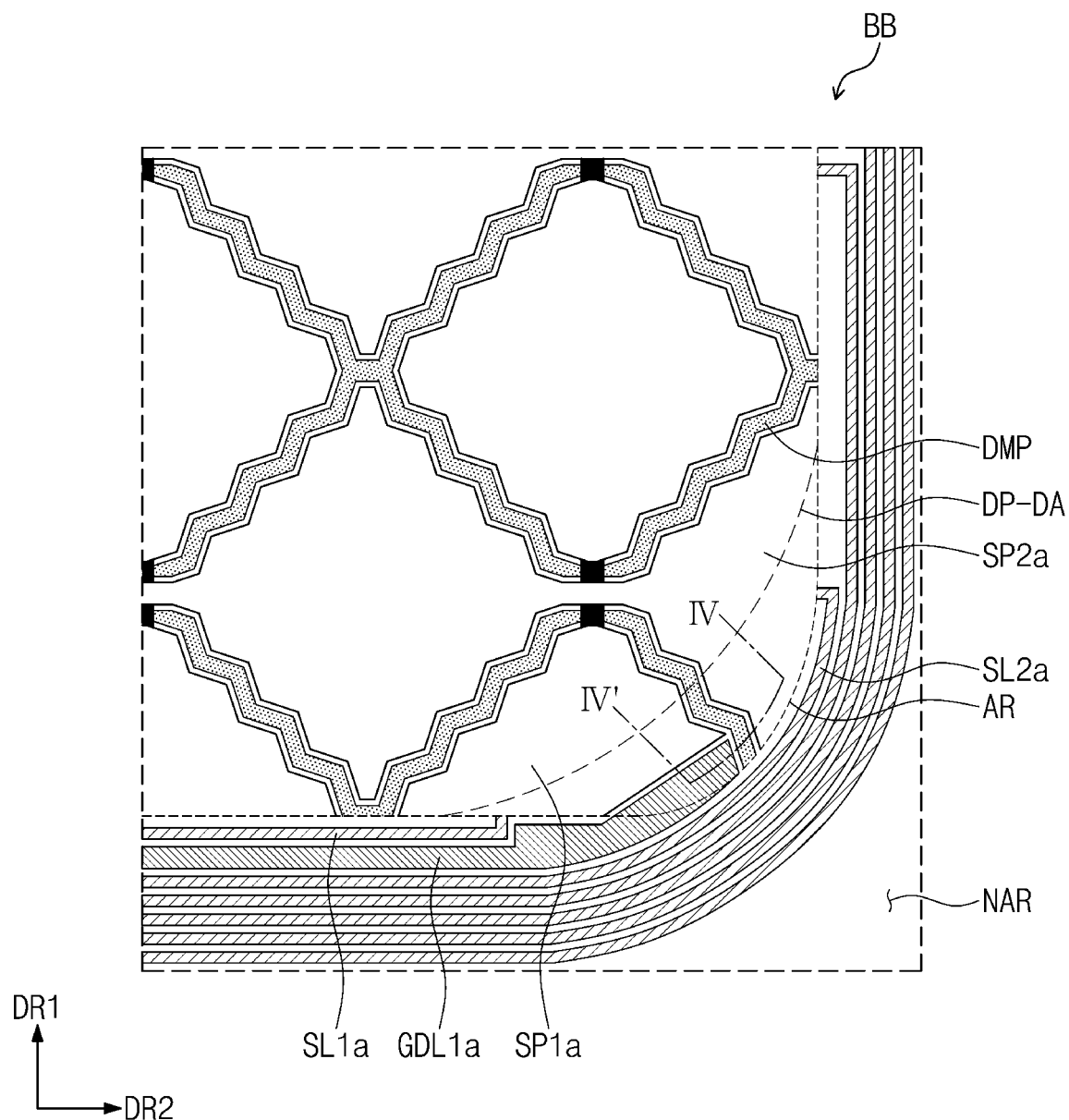
FIG. 9A is an enlarged view of an area BB shown in FIG. 5 according to an exemplary embodiment of an inventive concept.
Figure 9B:
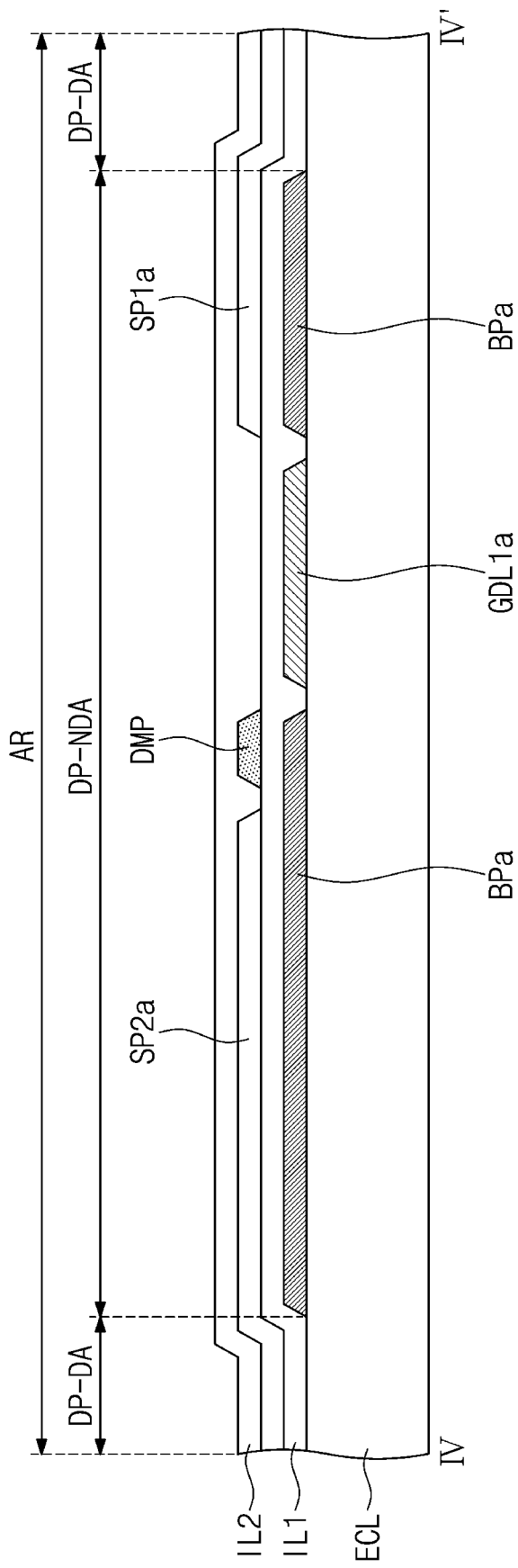
FIG. 9B is a cross-sectional view taken along the line IV-IV' shown in FIG. 9A.

FIG. 9A is an enlarged view of an area BB shown in FIG. 5 according to an exemplary embodiment of an inventive concept. FIG. 9B is a cross-sectional view taken along the line IV-IV' shown in FIG. 9A.

The exemplary embodiment of the input detection unit ISU shown in FIG. 9A may have a structure in which the secondary dummy pattern SDMP is omitted in comparison with the input detection unit ISU shown in FIG. 7A. For example, the first dummy line GDL1a may extend to occupy substantially the same area as the area occupied by the secondary dummy pattern SDMP according to the exemplary embodiment shown in FIG. 7A. In addition, since the structure and configuration of the remaining components other than the first dummy line GDL1a are substantially the same, a description thereof will be omitted for brevity.

Referring to FIG. 9A the first dummy line GDL1a, on a plane, may be disposed between the first pattern SP1a and the second signal line SL2a. That is, the first dummy line GDL1a may be arranged in the place where the secondary dummy pattern SDMP shown in FIG. 7A is disposed. For example, the first dummy line GDL1a may include a first portion overlapping the non-detection area NAR and disposed between the first signal lines SL1a and the second signal lines SL2a, including a second portion that extends from the first portion of the dummy line GDL1a and overlaps the detection area AR. For example, the region of the detection area AR overlapped by the second portion of the dummy line GDL1a might not be overlapped by the display area DP-DA.

Referring to FIG. 9B, the first dummy line GDL1a may be disposed on an encapsulation substrate ECL and may be covered by a first insulating layer IL1. Further, the first dummy line GDL1a may be disposed between the light blocking patterns BPa on the same layer. The light blocking pattern BPa may overlap both a first portion of a first pattern SP1a overlapping the non-display area DP-NDA, and a first portion of a first detection pattern SP2a overlapping the non-display area DP-NDA.

The first dummy line GD1a a may be in a floating state or may be supplied with a ground voltage through the first dummy pad GD1 (see FIG. 5). As a result, a voltage drop caused by coupling between the first pattern SP1a and the second signal line SL2a may be prevented by the first dummy line GDL1a disposed there between.

Figure 10:
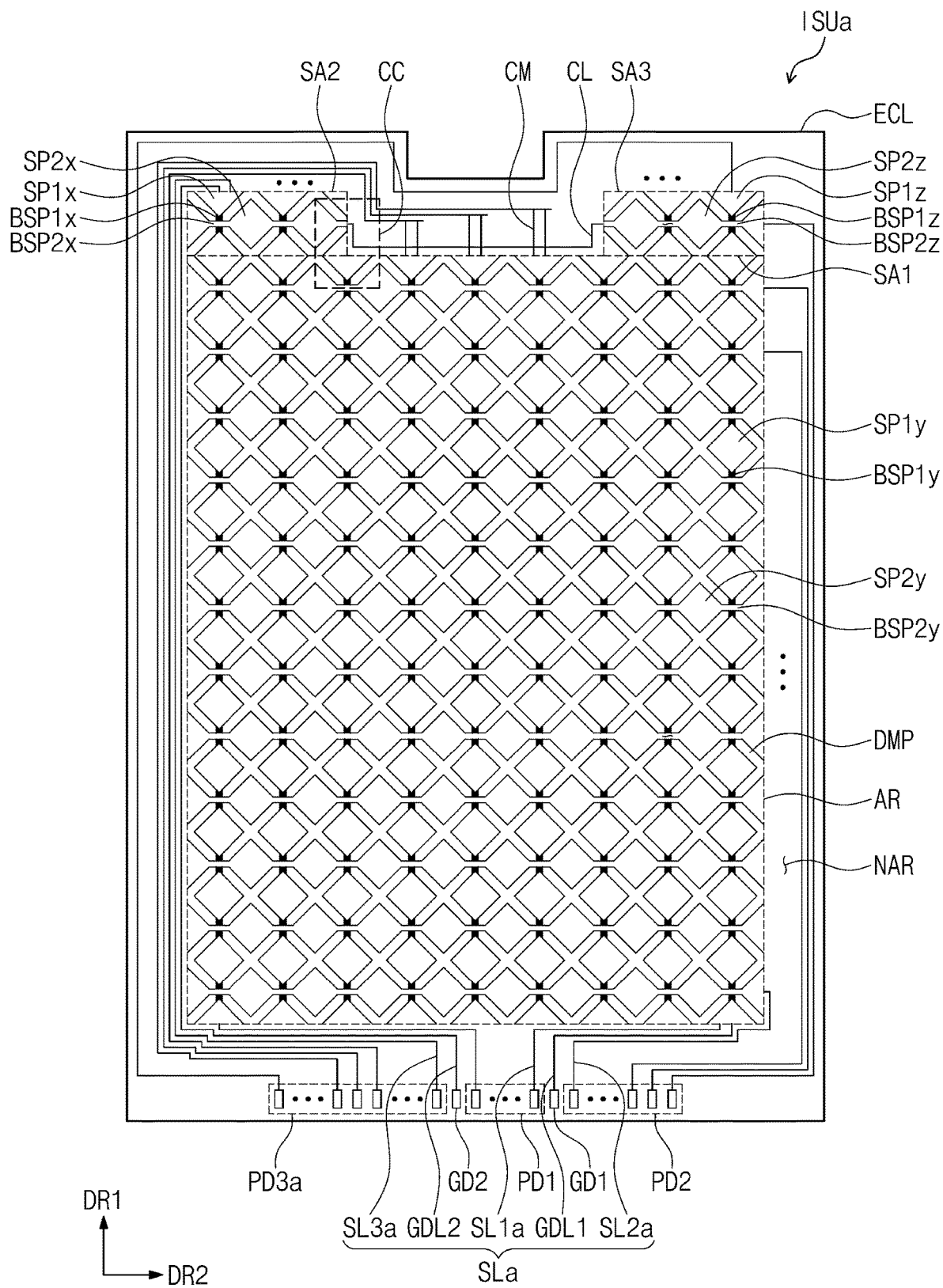
FIG. 10 is a plan view of an input detection unit according to an exemplary embodiment of the inventive concept.
Figure 11:
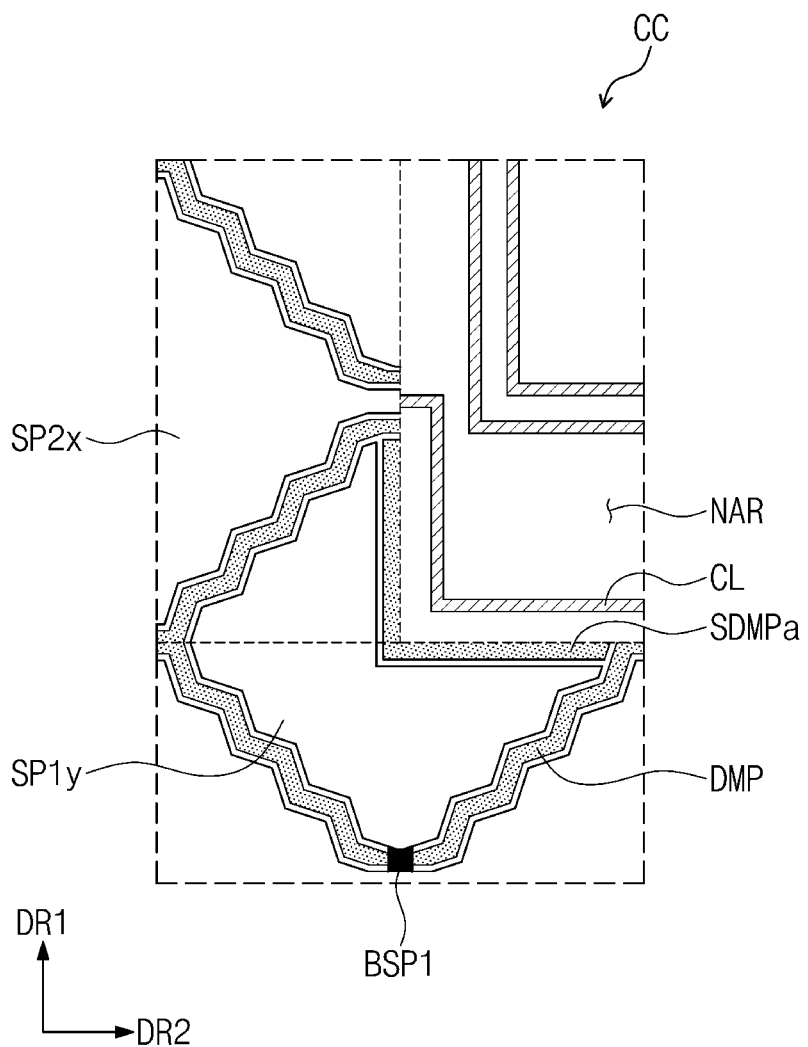
FIG. 11 is an enlarged view of area CC shown in FIG. 10.

FIG. 10 is a plan view of an input detection unit according to an exemplary embodiment of the inventive concept. FIG. 11 is an enlarged view of an area CC shown in FIG. 10.

Compared with the input detection unit ISU shown in FIG. 5, the input detection unit ISUa shown in FIG. 10 may have different shapes of the detection area AR and the non-detection area NAR. For example, viewed from a plan view, the detection area AR and the non-detection area NAR according to the exemplary embodiment shown in FIG. 10 may have corners formed by orthogonally connected lines throughout the perimeter of each.

In detail, referring to FIG. 10, the detection area AR may include a first detection area SA1, a second detection area SA2, and a third detection area SA3. The first detection area SA1 may have a rectangular shape on a plane. The second detection area SA2 and the third detection area SA3 may protrude from the first detection area SA1 in a first direction DR1. The first detection area SA1 may be referred to as a normal part and the second and third detection areas SA2 and DA3 may be referred to as notch parts. The first and second pads PD1 and PD2 may be substantially similar to those depicted in FIG. 5. However, the third pad in FIG. 10 PD3a may be different.

According to an exemplary embodiment of the inventive concept, the second and third detection areas SA2 and SA3 are provided in addition to the first detection area SA1. However, the number of detection areas provided that protrude from the first detection area SA1 is not limited. For example, the number of detection areas provided to protrude from the first detection area SA1 may be one, or may be three or more. The camera module CMA and the speaker SP described with reference to FIG. 1B may be disposed in an area between the second detection area SA2 and the third detection area SA3.

The second detection area SA2 protrudes from one side edge of the first detection area SA1 in a first direction DR1, and the third detection area SA3 protrudes from the other side edge of the first detection area SA1 in the first direction DR1. For example, the second and third detection areas SA2 and SA3 may protrude from left and right sides of the width of the first detection area SA1, respectively. The second detection area SA2 and the third detection area SA3 may be spaced apart from each other in a second direction DR2.

In detail, the input detection unit ISUa includes a first electrode, a second electrode, dummy electrodes DMP, secondary dummy electrodes SDMPa (shown in FIG. 11), and signal lines SLa.

The first electrode includes first patterns including normal patterns SP1y disposed in the first detection area SA1 and first notch patterns SP1x and SP1z disposed in the second detection area SA2 and the third detection area SA3, respectively. In addition, the first electrode includes first connection patterns BSP1y, BSP1x, and BSP1z that connect the first patterns and overlap the first to third detection areas SA1 to SA3, respectively.

The second electrode includes second patterns including detection patterns SP2y disposed in the first detection area SA1 and second notch patterns SP2x and SP2z disposed in the second detection area SA2 and the third detection area SA3, respectively. In addition, the second electrode includes second connection patterns BSP2y, BSP2x, and BSP2z that connect the second patterns and overlap the first to third detection areas SA1 to SA3, respectively.

The dummy electrodes DMP may be disposed between the first patterns (SP1y, SP1x, and SP1z) and the second patterns (SP2y, SP2x and SP2z).

The signal lines SLa may include first to third signal lines SL1a to SL1c, first and second dummy lines GDL1 to GDL2, and a first connection line CL and a second connection line CM.

The first signal lines SL1a are connected to the normal patterns SP1y arranged in the first detection area SA1. The second signal lines SL2a are connected to the detection patterns SP2y disposed in the first detection area SA1 and the second notch patterns SP2z disposed in the third detection area SA3. The third signal lines SL3a are respectively connected to the normal patterns SP1y disposed in the first detection area SA1, the first notch patterns SP1x disposed in the second detection area SA2, and the first notch patterns SP1z disposed in the third detection area SA3. The normal patterns SP1y to which the third signal lines SL3a are connected may be patterns adjacent to the area between the second detection area SA2 and the third detection area SA3. For example, the normal patterns SP1y to which the third signal lines SL3a are connected may be patterns disposed between the second detection area SA2 and the third detection area SA3, but not overlapped by the second detection area SA2 and third detection area SA3.

The first connection line CL may be disposed in the non-detection area NAR and may electrically connect the second notch patterns SP2x disposed in the second detection area SA2 and the second notch patterns SP2z disposed in the third detection area SA3. The third signal line SL3a is separated from the normal patterns SP1y in the first detection area SA1 by the first connection line CL. Therefore, a second connection line CM may be provided for connecting the third signal lines SL3a and the normal patterns SP1y in the first detection area SA1.

Referring to FIG. 11, the secondary dummy electrode SDMPa overlaps the first detection area SA1 and is disposed between the normal pattern of at least one of the normal patterns SP1y of the same row closest to the first connection line CL and the first connection line CL. As a result, by the secondary dummy electrode SDMPa having a floating state, one of the normal patterns and the first connection line CL may be spaced from each other on a plane. Therefore, the coupling due to the voltage difference between any one normal pattern and the first connection line CL may be prevented.

In addition, the secondary dummy electrode SDMPa may overlap the second detection area SA2, and may be disposed between the first notch pattern of any one of the first notch patterns of the same column closest to the first connection line CL and the first connection line CL. As a result, by a secondary dummy electrode SDMPa with a floating state, the any one first notch pattern and the first connection line CL may be spaced apart from each other on a plane. Thus, coupling between the first notch pattern and the first connection line CL due to a voltage difference may be prevented.

According to an exemplary embodiment of the inventive concept, coupling between the electrodes arranged in the detection area and the signal lines arranged in the non-detection area may be prevented. Therefore, the overall driving reliability of the display device may be increased.

Although the exemplary embodiments of the present invention have been described, it is understood that the present inventive concept is not be limited to the exemplary embodiments described, and that various changes and modifications can be made by one ordinary skilled in the art within the spirit and scope of the present inventive concept.

What is claimed is:

1. An input detection unit comprising:
a substrate including a detection area and a non-detection area adjacent to the detection area;
a plurality of first electrodes overlapping the detection area which extend in a first direction and are arranged successively in a second direction that intersects the first direction, wherein each of the first electrodes includes a plurality of first connection patterns and a plurality of first detection patterns connected through the first connection patterns;
a plurality of second electrodes overlapping the detection area, which are insulated from the first electrodes, extend in the second direction and are arranged successively along the first direction, wherein each of the second electrodes includes a plurality of second connection patterns and a plurality of second detection patterns connected through the second connection patterns;
dummy patterns overlapping the detection area and disposed between the first detection patterns and the second detection patterns in the detection area, the dummy patterns being either grounded or floated;
a secondary dummy pattern disposed adjacent to the dummy patterns, the secondary dummy pattern being either grounded or floated; and
signal lines overlapping the non-detection area,
wherein the signal lines include a first signal line connected to the first detection patterns and a second signal line connected to the second detection patterns,
wherein the plurality of first detection patterns includes a row of first detection patterns closest to the non-detection area, and
wherein the secondary dummy pattern overlaps a portion between the row of first detection patterns closest to the non-detection area and the second signal line, and
wherein the secondary dummy pattern is closer to the second signal line than the row of first detection patterns.

2. The input detection unit of claim 1, wherein the signal lines further comprise a first dummy line disposed between the first signal line and the second signal line, the first dummy line being either grounded or floated.

3. The input detection unit of claim 2, wherein the row of first detection patterns closest to the non-detection area includes two outermost first detection patterns, and wherein the second signal line is spaced apart from a first outermost first detection pattern, on a plane, with the secondary dummy pattern and the first dummy line disposed there between.

4. The input detection unit of claim 2, wherein the first detection patterns, the second detection patterns, the second connection patterns, the dummy patterns, and the secondary dummy pattern are disposed on a same layer.

5. The input detection unit of claim 4, wherein the first connection patterns and the signal lines are disposed on the same layer and the signal lines are disposed on a different layer from the first detection patterns.

6. The input detection unit of claim 1, wherein an outermost second detection pattern among the second detection patterns is connected to a first end of the second signal line and is provided as a partial shape of remaining second detection patterns of the same column.

7. The input detection unit of claim 6, wherein the outermost second detection pattern is adjacent to a first outermost first detection pattern, wherein the outermost second detection pattern has a larger area than the first outermost first detection pattern.

8. The input detection unit of claim 6, further comprising a light blocking pattern disposed on a different layer from the patterns and overlapping the first detection patterns and a portion of the second detection pattern.

9. The input detection unit of claim 1, wherein an area of a first outermost first detection pattern is larger than the area of the secondary dummy pattern, and a sum of the area of the first outermost first detection pattern and the area of the secondary dummy pattern is smaller than the area of each of the remaining first detection patterns of a same row.

10. The input detection unit of claim 1, wherein the signal lines further comprise a plurality of third signal lines connected to the first detection patterns, and first ends of the third signal lines are respectively connected to the first detection patterns of a row farthest from first detection patterns of a row closest to a non-detection area row in the first direction.

11. The input detection unit of claim 10, wherein the signal lines further comprise a second dummy line disposed between the first signal line and a third signal line, the second dummy line being either grounded or floated.

12. The input detection unit of claim 2, wherein the first dummy line comprises a first portion overlapping the non-detection area and disposed between the first signal line and the second signal line, and a second portion extending from the first portion and overlapping the detection area.

13. The input detection unit of claim 12, wherein the first detection patterns, the second detection patterns, the second connection patterns, and the dummy patterns are disposed on a same layer as one another, wherein the first connection patterns, the first signal line, the second signal line, and the first dummy line are disposed on a same layer as one another, and wherein the first detection patterns and the first dummy line are disposed on different layers from each other.

14. The input detection unit of claim 12, wherein the dummy line is provided with a ground voltage.

15. A display device comprising:
a display substrate including a display area and a non-display area adjacent to the display area;
an encapsulation member disposed on the display substrate and including a detection area and a non-detection area adjacent to the detection area;
a first conductive layer including a plurality of first connection patterns disposed on the encapsulation member and overlapping the detection area, and a plurality of signal lines overlapping the non-detection area;
an insulating layer disposed on the first conductive layer; and
a second conductive layer disposed on the insulating layer and overlapping the detection area and including a plurality of first detection patterns connected through the first connection patterns, a plurality of second connection patterns, a plurality of second detection patterns connected through the second connection patterns, din my patterns disposed in the detection area between the first detection patterns and the second detection patterns, and a secondary dummy pattern disposed adjacent to the dummy patterns,
wherein the dummy patterns and the secondary dummy pattern are either grounded or floated,
wherein the signal lines comprise a plurality of first signal lines connected to the first detection patterns and a plurality of second signal lines connected to the second detection patterns, two outermost first detection patterns among first detection patterns of a same row are closest to first ends of the first signal lines and provided as partial shapes of remaining first detection patterns of a same row, and the secondary dummy pattern overlaps an area between the two outermost first detection patterns and a second signal line adjacent to the two outermost first detection patterns, and
wherein the secondary dummy pattern is closer to the second signal line than the two outermost first detection patterns.

16. The display device of claim 15, wherein the two outermost first detection patterns among the first detection patterns of a same column connect to first ends of the plurality of second signal lines, and are provided as partial shapes of remaining second detection patterns of the same column.

17. The display device of claim 16, wherein the two outermost patterns comprise a first portion overlapping the display area and a second portion extending from the first portion and overlapping the non-display area, the two outermost second detection patterns comprise a first detection portion overlapping the display area and a second detection portion extending from the first detection portion and overlapping the non-display area.

18. The display device of claim 17, wherein the first conductive layer further comprises a light blocking pattern overlapping the second portion of the two outermost patterns and the second detection portion.

19. An input detection unit comprising:
a substrate including, a detection area with a first area on a plane, a second area protruding in one direction from the first area, and a third area spaced apart from the second area and protruding in the one direction from the first area, and a non-detection area disposed adjacent to the detection area; and
an input detection circuit configured to detect an input, wherein the input detection circuit comprises:
a first electrode including first patterns with normal patterns disposed in the first area and first notch patterns disposed in the second area and the third area, and first connection patterns configured to connect adjacent first patterns in the one direction;
a second electrode including second patterns with detection patterns disposed in the first area and second notch patterns disposed in the second area and the third area, and second connection patterns configured to connect the second patterns;
dummy electrodes disposed between the first patterns and the second patterns in the detection area;
a connection line disposed in the non-detection area and connecting the second notch patterns disposed in the second area and the third area; and
a first secondary dummy electrode overlapping the first area and disposed between the connection line and at least one normal pattern among normal patterns of a same row closest to the connection line,
wherein the dummy electrodes and the first secondary dummy electrode are either grounded or floated, and
wherein first secondary dummy is closer to the connection line than the at least one normal pattern among normal patterns of a same row closest to the connection line.

20. The input detection, unit of claim 19, further comprising a second secondary dummy electrode overlapping the second area and disposed between the connection line and a first notch pattern among first notch patterns of a same column closest to the connection line,
wherein the second secondary dummy electrode is grounded or floated.

* * * * *